United States Patent
Liang et al.

(10) Patent No.: US 10,782,606 B2
(45) Date of Patent: Sep. 22, 2020

(54) PHOTOLITHOGRAPHY METHODS AND STRUCTURES THAT REDUCE STOCHASTIC DEFECTS

(71) Applicant: GLOBALFOUNDRIES INC., Grand Cayman (KY)

(72) Inventors: Yong Liang, Niskayuna, NY (US); Lei Sun, Altamont, NY (US); Yongan Xu, Niskayuna, NY (US); Craig D. Higgins, Altamont, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 221 days.

(21) Appl. No.: 16/022,752

(22) Filed: Jun. 29, 2018

(65) Prior Publication Data
US 2020/0004155 A1    Jan. 2, 2020

(51) Int. Cl.
*G03F 1/22* (2012.01)
*G03F 7/20* (2006.01)

(52) U.S. Cl.
CPC .............. *G03F 1/22* (2013.01); *G03F 7/2004* (2013.01)

(58) Field of Classification Search
CPC ....................................................... G03F 1/22
See application file for complete search history.

(56) References Cited

U.S. PATENT DOCUMENTS

| | | | |
|---|---|---|---|
| 5,948,219 A | 9/1999 | Rohner | |
| 6,294,909 B1 | 9/2001 | Leedy | |
| 6,495,888 B1 | 12/2002 | Yamato | |
| 6,559,473 B1 | 5/2003 | Yu et al. | |
| 8,586,269 B2 | 11/2013 | Okoroanyanwu et al. | |
| 2004/0235227 A1* | 11/2004 | Kawase | G02F 1/1368 438/158 |
| 2005/0074706 A1 | 4/2005 | Bristol et al. | |

(Continued)

OTHER PUBLICATIONS

Fujii et al., "Patterning Performance of Chemically Amplified Resist in EUV Lithography," Proceedings of SPIE, SPIE Advanced Lithography, 2016, pp. 1-7.

(Continued)

*Primary Examiner* — Kathleen Duda
(74) *Attorney, Agent, or Firm* — Gibb & Riley, LLC; Anthony J. Canale

(57) ABSTRACT

Disclosed are embodiments of a multi-layer stack and photolithography methods and systems that employ such a stack. The disclosed multi-layer stacks include a photoresist layer on an underlayer. The photoresist layer and underlayer are made of different materials, which are selected so that valence and conduction band offsets between the underlayer and photoresist layer create an effective electric field (i.e., so that the stack is "self-biased"). When areas of the photoresist layer are exposed to radiation during photolithography and the radiation passes through photoresist layer and excites electrons in the underlayer, this effective electric field facilitates movement of the radiation-excited electrons from the underlayer into the radiation-exposed areas of the photoresist layer in a direction normal to the interface between the underlayer and the photoresist layer. Movement of the radiation-excited electrons from the underlayer into the radiation-exposed areas of the photoresist layer improves photoresist layer development and pattern resolution.

16 Claims, 11 Drawing Sheets

(56) References Cited

U.S. PATENT DOCUMENTS

| | | |
|---|---|---|
| 2008/0220380 A1 | 9/2008 | Bristol et al. |
| 2009/0109595 A1 | 4/2009 | Herchen et al. |
| 2016/0172509 A1* | 6/2016 | Nishida ............. H01L 29/66833 257/326 |

OTHER PUBLICATIONS

Poppe et al., "Improved Performance of Apex-E Photoresist with the Application of the Electric-Field-Enhanced PEB," Proceedings of SPIE, Microlithography, 2004, pp. 1-7.

Sakiyama et al., "Carrier Density and Mobility in n-Doped Poly(p-Phenylene Vinylene)," Joint Journal of Novel Carbon Resource Sciences & Green Asia Strategy, vol. 03, Issue 01, 2016, pp. 18-20.

\* cited by examiner

Step down for electrons from
Lowest Cb of Underlayer 151
To LUMO of Photoresist Layer 153

No step down for holes from
Highest Vb of Underlayer 151
To HOMO of Photoresist Layer 153

● = electrons

○ = holes

Self-Biased Multilayer Stack With:

5nm HfO2, 2nm HMDS, and 35nm Photoresist

Self-Biased Multilayer Stack With:

5nm HfO2, 2nm HMDS, and 35nm Photoresist

PHOTOLITHOGRAPHY METHODS AND STRUCTURES THAT REDUCE STOCHASTIC DEFECTS

BACKGROUND

Field of the Invention

The present invention relates to photolithography and, more particularly, to photolithography methods, structures and systems that reduce stochastic defects in layers patterned using EUV photolithography.

Description of Related Art

Photolithography techniques are used to pattern features on semiconductor wafers during integrated circuit (IC) chip manufacturing. Advances in photolithography have, in part, enabled device scaling. Currently, extreme ultraviolet (EUV) photolithography is poised to complement and eventually replace conventional deep ultraviolet (DUV) photolithography due to the significantly shorter illumination wavelength ($\lambda$) used, which has the potential to provide enhanced patterning resolution and lower process complexity, among other benefits. For example, EUV photolithography techniques employing EUV radiation with a wavelength ($\lambda$) of 13.5 nm may be used to achieve a less than 10 nm half pitch resolution at a single exposure, whereas DUV photolithography techniques employ DUV radiation with a wavelength ($\lambda$) of 193 nm in order to achieve a minimum 40 nm half pitch resolution at single exposure. One fundamental challenge in EUV photolithography is the occurrence of stochastic defects. Causes of stochastic defects can include, but are not limited to, weak EUV radiation intensity, poor absorption of photons by the photoresist layer (e.g., less than 20% absorption of photons by the photoresist layer) or an inefficient photoreaction between the exposed portions of the photoresist layer and the EUV radiation. In the case of a positive photoresist layer, the exposed areas may not become completely soluble to the positive photoresist developer, leading to missing or only partial via openings, trenches etc. In the case of a negative photoresist layer, the exposed areas may not be completely insoluble to the negative photoresist developer. Thus, there is a need in the art for an EUV structure and method that minimizes the occurrence of stochastic defects.

SUMMARY

More particularly, disclosed herein are embodiments of photolithography structures, methods and systems.

A structure and, particularly, a "self-biased" multi-layer stack for use during photolithography (e.g., during extreme ultraviolet (EUV) photolithography) can include an underlayer on a substrate, a photoresist layer on the underlayer with an optional interface layer between the underlayer and photoresist layer. The underlayer and the photoresist layer can be made of different materials. The material of the underlayer can have a relatively high extinction coefficient at EUV wavelengths). Additionally, the different materials of the underlayer and photoresist layer can be selected so that positive valence and conduction band offsets between those different materials create an effective electric field between the underlayer and the photoresist layer (i.e., cause the multi-layer stack to be "self-biased"). Specifically, the underlayer can have a bandgap between the maximum valence band (Vb) energy and the minimum conduction band (Cb) energy, the photoresist layer can have a highest occupied molecular orbital (HOMO)-lowest unoccupied molecular orbital (LUMO) gap between a HOMO energy and a LUMO energy, and the different materials of the underlayer and photoresist layer can be selected so that the following band offset conditions between the underlayer and the photoresist layer are met: (1) the maximum Vb energy of the underlayer is higher than the HOMO energy of the photoresist layer such that the difference between the maximum Vb energy of the underlayer and the HOMO energy of the photoresist layer is greater than 0.0 eV; and (2) the minimum Cb energy of the underlayer is higher than the LUMO energy of the photoresist layer such that the difference between the minimum Cb energy of the underlayer and the LUMO energy of the photoresist layer is greater than 0.0 eV. The resulting effective electric field between the underlayer and the photoresist layer will facilitate movement of radiation-excited electrons from the underlayer into radiation-exposed areas of the photoresist layer in a direction that is essentially normal to an interface between the underlayer and the photoresist layer and will also impede movement of radiation-excited holes from the underlayer into the photoresist layer.

One exemplary "self-biased" multi-layer stack can include an underlayer and a photoresist layer on the underlayer. The underlayer can be a layer of any of the following materials: indium(III) oxide, nickel(II) oxide, zinc oxide, copper(I) oxide, cobalt (III) oxide, hafnium(IV) oxide, and chromium (III) oxide. The photoresist layer can be a chemically amplified positive organic photoresist layer, a chemically amplified negative organic photoresist layer or a non-chemically amplified photoresist layer.

Another exemplary "self-biased" multi-layer stack can include a p-type underlayer and an n-type photoresist layer on the underlayer.

Also disclosed herein are embodiments of a photolithography method using such a "self-biased" multi-layer stack. Generally, the photolithography method can include providing a "self-biased" multi-layer stack, as described in the structure embodiments above. The method can further include exposing areas of the photoresist layer to radiation (e.g., extreme ultraviolet (EUV) radiation) using a reticle. During this exposure process, at least a portion of the radiation passes through the radiation-exposed areas of the photoresist layer into the underlayer and excites electrons and holes within the underlayer. An effective electric field, which is present at the interface between the underlayer and the photoresist layer (e.g., due to the positive valence and conduction band offsets), facilitates movement of the radiation-excited electrons from the underlayer into the radiation-exposed areas of the photoresist layer in a direction that is essentially normal to an interface between the underlayer and the photoresist layer and also impedes movement of radiation-excited holes from the underlayer into the photoresist layer.

For example, an embodiment of a photolithography method can include providing a substrate (e.g., a feature layer to be patterned). A hardmask layer can be formed on the substrate and an organic planarization layer (OPL) can be formed on the hardmask layer. A "self-biased" multi-layer stack can be formed on the OPL. That is, an underlayer can be formed on the OPL and a photoresist layer can be formed on the underlayer with an optional interface layer between the underlayer and photoresist layer. As discussed above, with regard to the structure embodiment, the underlayer and the photoresist layer can be made of different materials. The material of the underlayer can have a relatively high extinction coefficient at EUV wavelengths. Additionally, the different materials of the underlayer and photoresist layer can be selected so that positive valence and conduction band offsets between the different materials create an effective electric field between the underlayer and the photoresist layer (i.e., cause the multi-layer stack to be "self-biased"). Specifically, the underlayer can have a bandgap between the maximum valence band (Vb) energy and minimum conduction band (Cb) energy, the photoresist layer can have a highest occupied molecular orbital (HOMO)-lowest unoccupied molecular orbital (LUMO) gap between a HOMO energy and a LUMO energy and the different materials of the underlayer and photoresist layer can be selected so that the following band offset conditions between the underlayer and the photoresist layer are met at the same time: (1) the maximum Vb energy of the underlayer is higher than the HOMO energy of the photoresist layer such that the difference between the maximum Vb energy of the underlayer and the HOMO energy of the photoresist layer is greater than 0.0 eV; and (2) the minimum Cb energy of the underlayer is higher than the LUMO energy of the photoresist layer such that the difference between the minimum Cb energy of the underlayer and the LUMO energy of the photoresist layer is greater than 0.0 eV.

The method can further include exposing areas of the photoresist layer to radiation (e.g., EUV radiation), using a reticle. During this exposure process, at least a portion of the radiation passes through the radiation-exposed areas of the photoresist layer into the underlayer and excites electrons and holes within the underlayer. The effective electric field, which is present due to the positive valence and conduction band offsets, facilitates movement of the radiation-excited electrons from the underlayer into the radiation-exposed areas of the photoresist layer in a direction that is essentially normal to an interface between the underlayer and the photoresist layer and also impedes movement of radiation-excited holes from the underlayer into the photoresist layer.

After the exposure process is complete, a photoresist developer can be applied to the photoresist layer to develop a pattern within the photoresist layer. Due to the radiation-excited electrons that have moved from the underlayer into the radiation-exposed areas of the photoresist layer, the resolution and stochastic effect of the pattern will be improved as compared to that achievable without the "self-biased" multi-layer stack. Once the photoresist layer is developed, anisotropic etch processes can be performed in order to transfer the pattern through the underlayer, the OPL, the hardmask layer and into the substrate (e.g., into the feature layer to be patterned).

BRIEF DESCRIPTION OF THE SEVERAL VIEWS OF THE DRAWINGS

The present invention will be better understood from the following detailed description with reference to the drawings, which are not necessarily drawn to scale and in which.

DETAILED DESCRIPTION

As mentioned above, one fundamental challenge in EUV photolithography is the occurrence of stochastic defects. Causes of stochastic defects can include, but are not limited to, weak EUV radiation intensity, poor absorption of photons by the photoresist layer (e.g., less than 20% absorption of photons by the photoresist layer) or an inefficient reaction between the exposed portions of the photoresist layer and the EUV radiation. In the case of a positive photoresist layer, the exposed areas may not become completely soluble to the positive photoresist developer, leading to missing or only partial via openings, trenches etc. In the case of a negative photoresist layer, the exposed areas may not be completely insoluble to the negative photoresist developer. Thus, there is a need in the art for an EUV structure and method that minimizes the occurrence of stochastic defects.

In view of the foregoing, disclosed herein are embodiments of a structure and, particularly, a "self-biased" multi-layer stack and methods and systems that use the "self-biased" multi-layer stack during photolithography (e.g., during extreme ultraviolet (EUV) photolithography) for improved pattern resolution. Specifically, the multi-layer stack includes a photoresist layer and an underlayer below the photoresist layer (e.g., either immediately adjacent to or adhered to by a thin interface layer). The underlayer and the photoresist layer are made of different materials. The material of the underlayer is specifically selected so that the underlayer has a relatively high radiation extinction coefficient at EUV wavelengths and so that positive valence and conduction band offsets between the underlayer and the photoresist layer create an effective internal electric field (i.e., cause the multi-layer stack to be "self-biased"). When areas of the photoresist layer are subsequently exposed to radiation (e.g., EUV radiation) and the radiation passes through to the underlayer, the effective electric field facilitates movement of any radiation-excited electrons from the underlayer into the radiation-exposed areas of the photoresist layer in a direction that is essentially normal to an interface between the underlayer and the photoresist layer and also impedes movement of holes from the underlayer into the photoresist layer. The addition of these radiation-excited electrons in the radiation-exposed areas of the photoresist layer improves the efficiency of the photoreaction between the radiation and the photoresist material within the radiation-exposed areas, thereby enhancing photoresist layer development and pattern resolution and eliminating or at least minimizing stochastic defects.

Figure 1A:
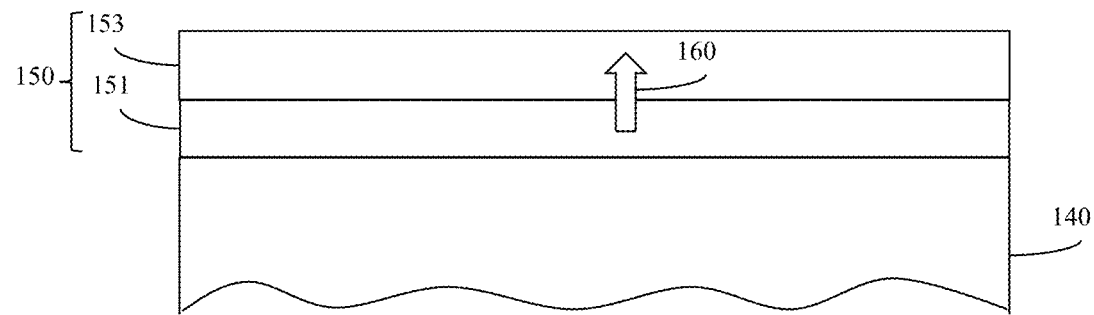
FIG. 1A is a cross-section diagram illustrating an embodiment of a "self-biased" multi-layer stack for use during photolithography.
Figure 1B:
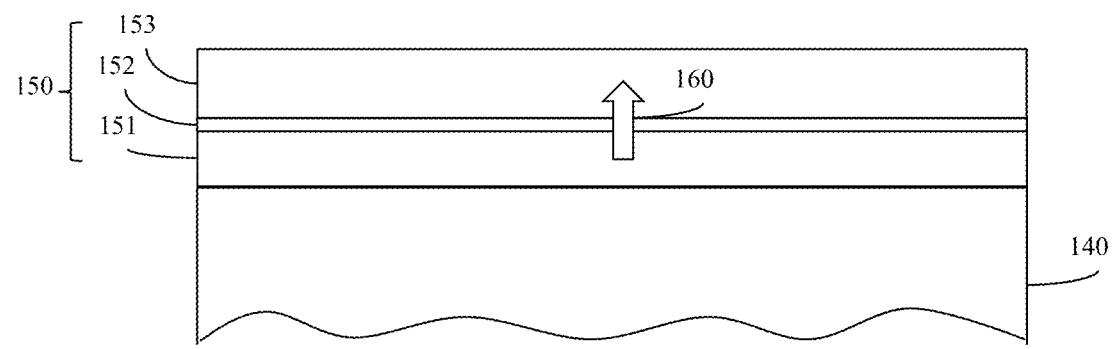
FIG. 1B is a cross-section diagram illustrating another embodiment of a "self-biased" multi-layer stack for use during photolithography.

Referring to FIGS. 1A and 1B disclosed herein are embodiments of a unique "self-biased" multi-layer stack 150 for use during photolithography (e.g., for use during extreme ultraviolet (EUV) photolithography).

The multi-layer stack 150 can include an underlayer 151 on the substrate 140 and a photoresist layer 153 above the underlayer 151. This multi-layer stack 150 will typically be formed on a substrate 140 to include an initial multi-layer structure, which includes a surface or layer that is to be patterned with shapes (e.g., openings, trenches, pillars, fins, etc.) using a photolithography method (e.g., EUV photolithography). The underlayer 151 is referred to as such because it is positioned under the photoresist layer 153 within the multi-layer stack 150 (i.e., between the substrate 140 and the photoresist layer 153). In any case the underlayer 151 and the photoresist layer 153 can be made of different materials and these different materials can be selected in order to achieve the "self-biased" state.

For purposes of this disclosure, the "self-biased" state refers to a state where, due to the materials of the different layers 151 and 153, an effective electric field 160 is internally generated within the multi-layer stack 150 and, more particularly, a specific electromotive force (EMF) is internally generated within the multi-layer stack 150. As used herein, EMF refers to a force that causes charge carriers (i.e., electrons and/or holes) to move in a particular direction. That is, EMF is a "directional force" exerted upon charge carriers (e.g., on electrons and/or holes). In the present invention as discussed in greater detail below, the internally generated effective electric field 160 (i.e., the internally generated specific EMF) in the multi-layer stack 150 will cause radiation-exposed electrons to move in one direction from the underlayer 151 into radiation-exposed areas of the photoresist layer 153 (and not in the reverse direction or in random directions) and will also impede radiation-exposed holes from moving across the underlayer-photoresist layer interface.

More specifically, the photoresist layer 153 can be, for example, a conventional chemically amplified organic photoresist layer and, particularly either a chemically amplified positive organic photoresist layer or a chemically amplified negative organic photoresist layer. Those skilled in the art will recognize that a "positive photoresist layer" refers to a photoresist layer in which exposed areas will become soluble to a photoresist developer and removed during photoresist development. A "negative photoresist layer" refers to a photoresist layer in which exposed areas will become insoluble to a photoresist developer. In this case, the non-exposed areas will be removed during photoresist development. Alternatively, the photoresist layer 153 could be a non-chemically amplified inorganic photoresist layer (e.g., a metal or metal oxide contained resist). In any case, the photoresist layer 153 can have a thickness that ranges, for example, between 10 nm and 50 nm (e.g., 35 nm).

The underlayer 151 can have a relatively high radiation extinction coefficient, given the type of photolithography at issue. For example, for EUV photolithography, the underlayer 151 can have a radiation extinction coefficient of at least 0.02 at EUV wavelengths. The underlayer 151 can also have a relatively high radiation absorption percentage (e.g., a 25% or more radiation absorption percentage at EUV wavelengths for a 10 nm thick film). Those skilled in the art will recognize that the radiation absorption percentage will depend, not only on the type of material used for the underlayer but also the thickness. Additionally, the material of the underlayer 151 can be selected, given the material of the photoresist layer 153, in order to achieve particular positive valence and conduction band offsets between the different materials that create (i.e., internally generate) an effective electric field 160 between the underlayer 151 and the photoresist layer 153 (i.e., cause the multi-layer stack to be "self-biased"). As mentioned above, the "self-biased" state refers to a state where, due to the materials of the different layers 151 and 153, an effective electric field is internally generated within the multi-layer stack 150 and, more particularly, a specific electromotive force (EMF) is internally generated within the multi-layer stack 150.

To achieve this "self-biased" state, the underlayer 151 can have a bandgap between the maximum valence band energy (Vb) and minimum conduction band (Cb) energy, the photoresist layer 153 can have a HOMO-LUMO gap between the highest occupied molecular orbital (HOMO) energy and the lowest unoccupied molecular orbital (LUMO) energy and the different materials of the underlayer 151 and photoresist layer 153 can be selected so that the following band offset conditions between the underlayer 151 and the photoresist layer 153 are met: (1) the maximum Vb energy of the underlayer 151 is higher, and preferably higher by at least 0.2 eV, than the HOMO energy of the photoresist layer 153 such that the difference between the maximum Vb energy of the underlayer 151 and the HOMO energy of the photoresist layer 153 is greater than 0.0 eV and, preferably at least 0.2 eV; and (2) the minimum Cb energy of the underlayer 151 is higher, and preferably higher by at least 0.2 eV, than the LUMO energy of the photoresist layer 153 such that the difference between the minimum Cb energy of the underlayer 151 and the LUMO energy of the photoresist layer 153 is greater than 0.0 eV and, preferably is at least 0.2 eV.

It should be understood that, for purposes of this disclosure, the conduction band offset is the difference between the Cb energy of the underlayer 151 and the LUMO energy of the photoresist layer 153. Furthermore, the valence band offset is the difference between the Vb energy of the underlayer 151 and the HOMO energy of the photoresist layer 153. These band offset conditions will impact charge carrier movement (i.e., electron and hole movement) between the underlayer 151 and the photoresist layer 153. For example, when the conduction band offset is >0, the condition favors electron ($e^-$) movement from underlayer 151 into the photoresist layer 153 (which is a first preferred condition in this invention). Conversely, when conduction band offset is <0, the condition impedes electron (e⁻) movement from underlayer 151 into the photoresist 153 (which is a condition to be avoided in this invention). It is the opposite for holes (o⁺). That is, when the valence band offset >0, the condition impedes hole (o⁺) movement from underlayer 151 into the photoresist layer 153 (which is a second preferred condition in this invention). Conversely, when the valence band offset is <0, the conditions favors movement holes (o⁺) from the underlayer 151 into the photoresist layer 153 (which is another condition to be avoided in this invention). In other words, by selecting underlayer and photoresist materials with the above-described band offset conditions, an internally generated effective electric field and, more particularly, an internally generated specific EMF can be created within the multi-layer stack and will cause radiation-exposed electrons to move in one direction from the underlayer 151 into radiation-exposed areas of the photoresist layer 153 (and not in the reverse direction or in random directions) and that will also impede radiation-exposed holes from moving across the underlayer-photoresist layer interface.

Another consideration for selection of the material of the underlayer 151 can include etch selectivity over the materials of the photoresist layer 153 as well as over the materials of substrate 140 below.

Figure 2A:
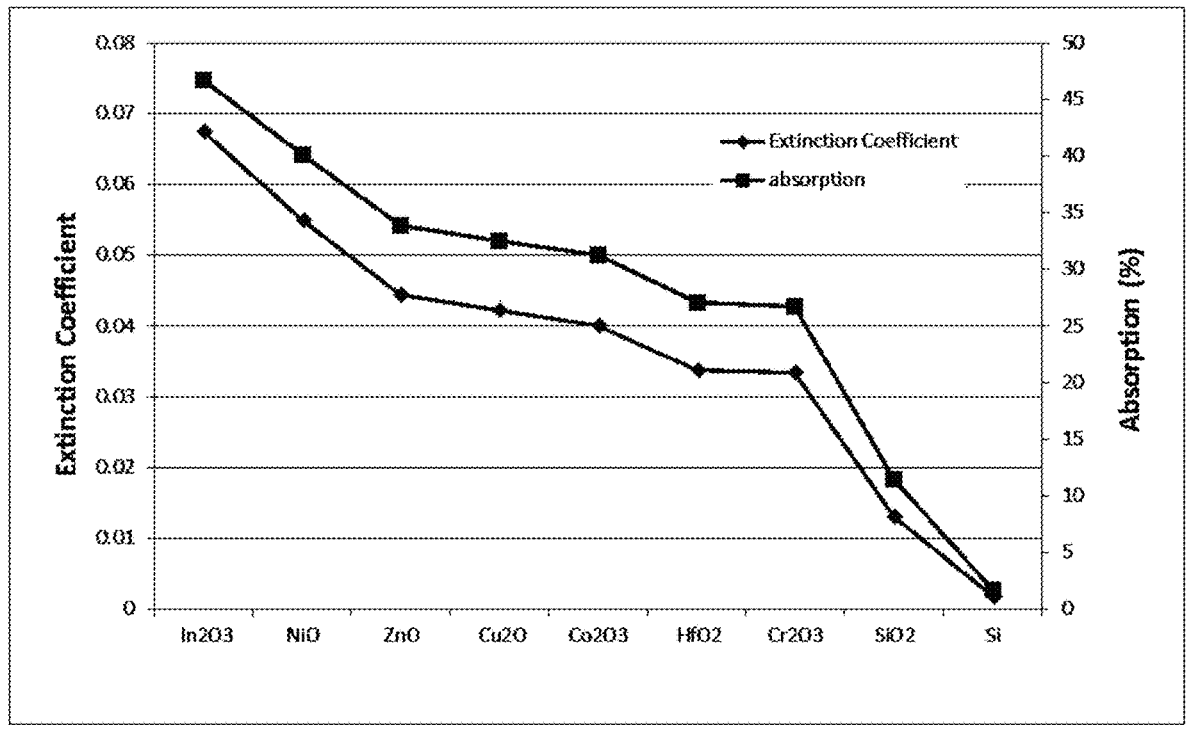
FIG. 2A is a graph illustrating extinction coefficients and radiation absorption percentages for exemplary materials that can be incorporated as an underlayer in the disclosed "self-biased" multi-layer stacks.
Figure 2B:
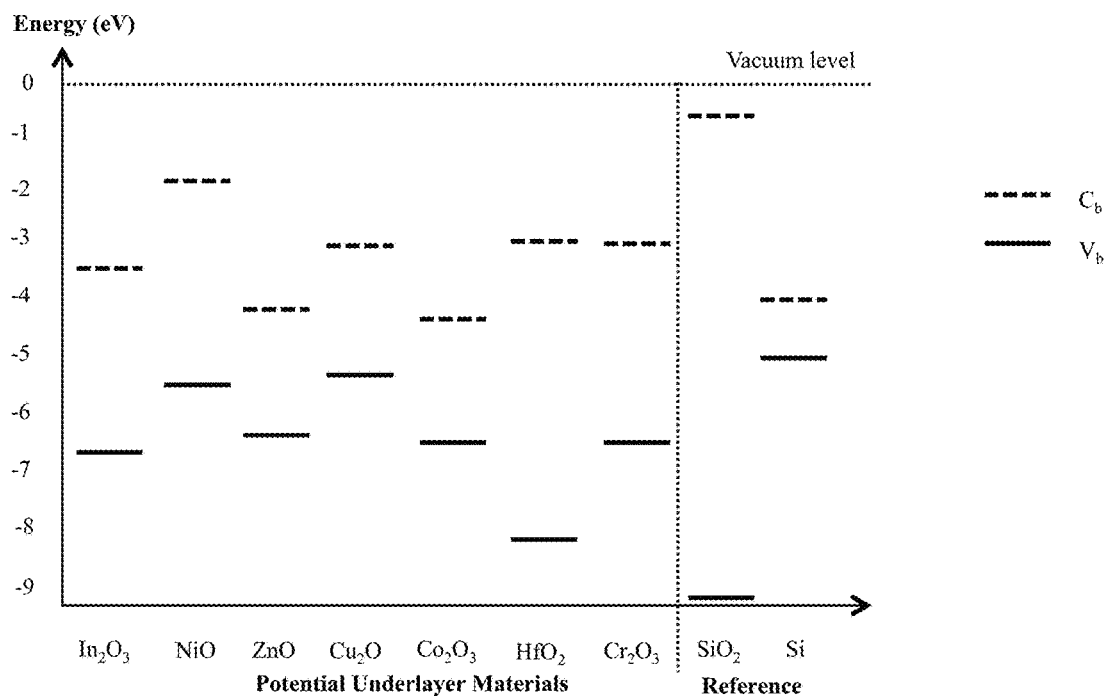
FIG. 2B is a chart illustrating the maximum Vb energy and minimum Cb energy for the materials shown in FIG. 2A.

FIG. 2A is a graph illustrating exemplary materials that have the desired EUV extinction coefficient of at least 0.02, a desired EUV radiation absorption percentage of at least 25% (given a fixed layer thickness of, for example, 10 nm), that have the desired etch selectivity and that further can be used for the underlayer 151 in order to achieve the desired positive valence and conduction band offset (e.g., given the use of a conventional chemical amplified photoresist with, for example, a LUMO energy of −2 eV to −5 eV and a HOMO energy of −5 eV to −8 eV range). These exemplary materials are relatively wide band gap semiconductors and include indium(III) oxide ($In_2O_3$), nickel(II) oxide (i.e., NiO), zinc oxide (ZnO), copper(I) oxide ($Cu_2O$), cobalt (III) oxide ($Co_2O_3$), hafnium(IV) oxide ($HfO_2$), and chromium (III) oxide ($Cr_2O_3$). It should be noted that in the graph of FIG. 2A, silicon dioxide and silicon are shown as references only. FIG. 2B is a chart illustrating the minimum Cb energy and the maximum Vb energy for each of these different materials. As indicated, the Cb and Vb energy values will both be negative with respect to a vacuum level.

Optionally, the underlayer 151 can also be doped with oxygen vacancies, interstitial cation or anion elements, or other implantation materials for higher p-type conductivity within the underlayer 151. For example, optionally, the underlayer 151 can be doped with dopants including, but not limited to, any one or more of the following: zinc (Zn), antimony (Sb), arsenic (As), and/or phosphorus (P) with an implantation energy ranging from 0.5 keV to 3 keV and a dose from 1E12/cm2 to 1E16 ions/cm2.

More specifically, in embodiments disclosed herein, the desired positive valence and conduction band offsets in the "self-biased" multi-layer stack 150 and, thereby the effective electric field 160, can be achieved by creating a p-n junction at the interface between the underlayer 151 and the photoresist layer 153. That is, the underlayer 151 can be a p-type underlayer and the photoresist layer 153 can be an n-type photoresist layer. The p-type underlayer can be a wide band gap p-type semiconductor layer. For example, the p-type underlayer could be a nickel(II) oxide (i.e., NiO) layer or a copper(I) oxide ($Cu_2O$) layer that is doped with interstitial oxygen and/or has cation vacancies so that the underlayer has the desired p-type conductivity. Alternatively, the p-type underlayer could be a zinc oxide (ZnO) layer doped with zinc (Zn), antimony (Sb), arsenic (As), and/or phosphorus (P) vacancies as acceptors so that the underlayer has the desired p-type conductivity. The n-type photoresist layer could be a chemically amplified positive organic photoresist layer, which is either doped to achieve the desired n-type conductivity or which naturally has the desired n-type conductivity. Alternatively, the n-type photoresist layer can be a chemically amplified negative organic photoresist layer or a non-chemically amplified photoresist layer that naturally has the desired n-type conductivity.

In any case, the underlayer 151 can be relatively thin as compared to the photoresist layer 153. For example, the underlayer 151 can have a thickness that ranges, for example, between 2 nm and 20 nm (e.g., 10 nm).

It should be noted that the photoresist layer 153 can be above and immediately adjacent to the underlayer 151, as illustrated in FIG. 1A. Alternatively, a thin interface layer 152 can be at the interface between the underlayer 151 and photoresist layer 153, as illustrated in FIG. 1B. This interface layer 152 can be employed to enhance adhesion of the photoresist layer 153 to the underlayer 151, to facilitate charge movement, or for any other suitable purposes. The material and thickness of the interface layer 152 can be selected so that the interface layer 152 does not interfere with the effective electric field 160. For example, to avoid interference with the effective electric field 160 and to shorten the travel distance for EUV excited electrons from the underlayer 151 to the photoresist 153. The material of the interface layer 152 should be relatively thin (e.g., less than 10 nm) and preferably should be neither a metal, nor a narrow bandgap semiconductor. For example, the interface layer 152 can be a spin-on organic material (e.g., an OPL), a self-assembled mono-layer material (e.g., hexamethyldisilazane (HMDS)), or any other suitable interface material. For example, in one exemplary embodiment the interface layer 152 could be a 1 nm layer of hexamethyldisilazane (HMDS).

Figure 3:
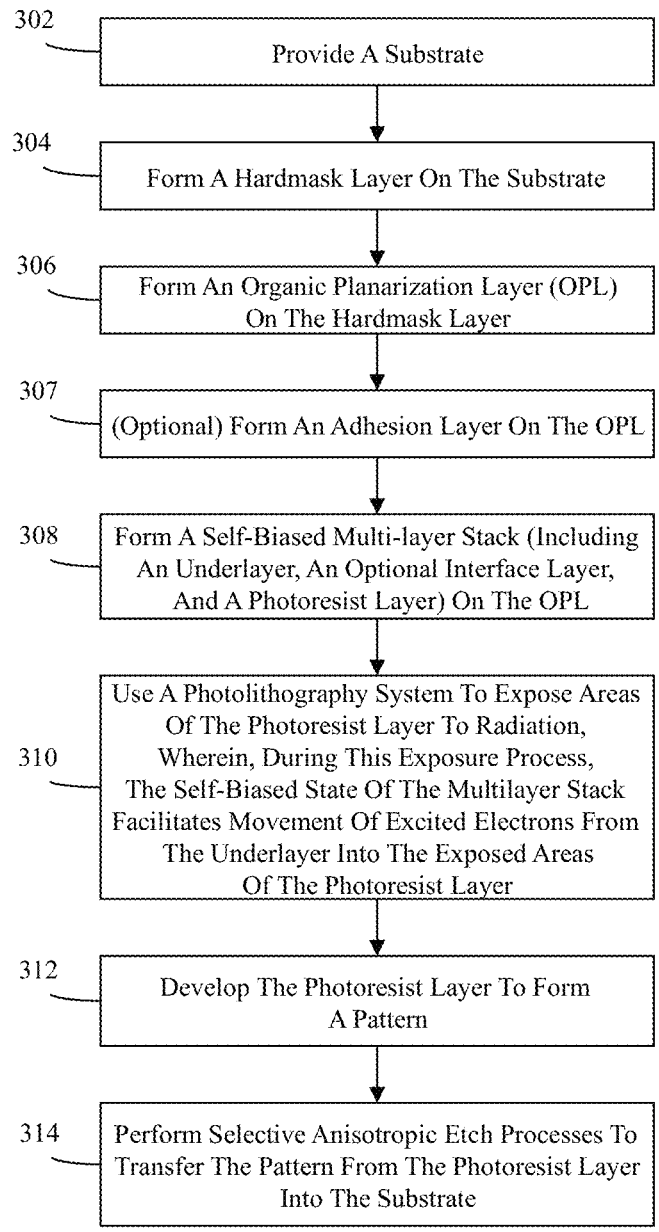
FIG. 3 is flow diagram illustrating a photolithography method that can be performed using the disclosed "self-biased" multi-layer stack.

Also disclosed herein are embodiments of a photolithography method that employs the above-described "self-biased" multi-layer stack 150. More particularly, referring to the flow diagram of FIG. 3, an embodiment of a photolithography method can include forming an initial multi-layer structure 140, which includes a surface or layer that is to be patterned with shapes (e.g., openings, trenches, pillars, fins, etc.) using a photolithography method (e.g., EUV photolithography). For example, the method can include providing a substrate 141 (see process 302 and FIGS. 4A-4B). This substrate 141 can be, for example, a semiconductor wafer (e.g., a bulk semiconductor wafer or a semiconductor-on-insulator wafer) and, optionally, one or more front of the line (FEOL), middle of the line (MOL), and back end of the line (BEOL) layers (not shown) (e.g., dielectric layers, metal layers, etc.) stacked above the semiconductor wafer. In any case, the substrate 141 can include the surface 145 to be patterned and it should be understood that this surface 145 can be either the semiconductor wafer itself or at least the uppermost layer stacked on the semiconductor wafer.

One or more additional layers can, optionally, be formed on the surface 145. For example, a hardmask layer 142 can be formed immediately adjacent to the surface 145 of the substrate 141 (see process 304 and FIGS. 4A-4B). The hardmask layer 142 can be a silicon nitride hardmask layer or any other suitable hardmask layer. An organic planarization layer (OPL) 143 can be formed on the hardmask layer 142 (see process 306 and FIGS. 4A-4B).

Figure 4A:
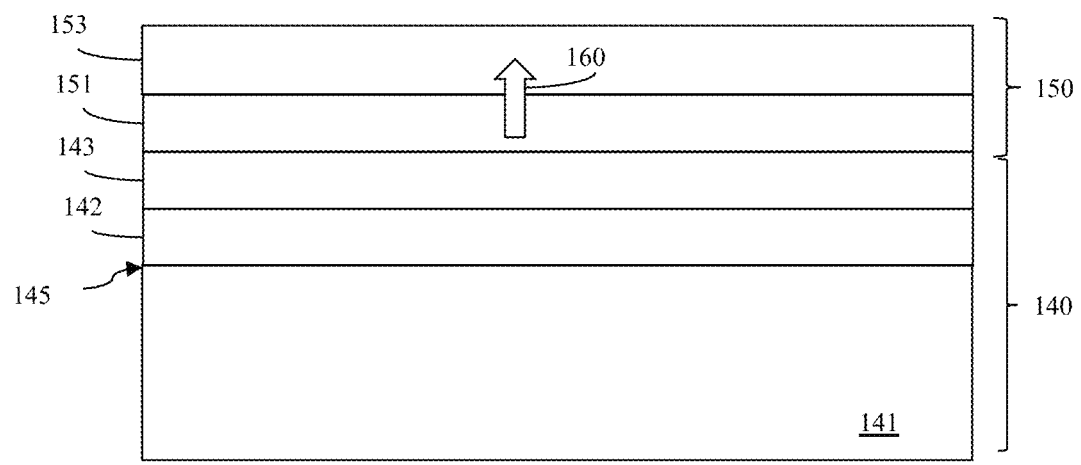
FIG. 4A is a cross-section diagram illustrating the "self-biased" multi-layer stack of FIG. 1A formed on a stack of layers to be patterned according to the disclosed method.
Figure 4B:
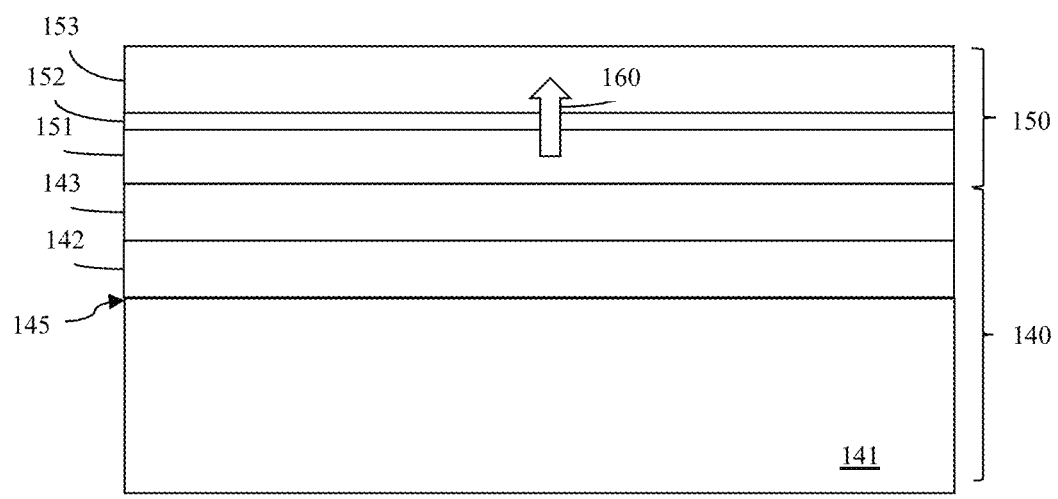
FIG. 4B is a cross-section diagram illustrating the "self-biased" multi-layer stack of FIG. 1B formed on a stack of layers to be patterned according to the disclosed method.

A "self-biased" multi-layer stack 150 can be formed on the OPL 143 (see process 308 and FIGS. 4A-4B). Specifically, the underlayer 151 can be formed (e.g., deposited) on the OPL 143. See the detailed discussion above regarding the possible materials for and thickness of the underlayer 151. Such an underlayer 151 can be deposited onto the OPL 143 using any suitable deposition technique (e.g., plasma vapor deposition (PVD), chemical vapor deposition (CVD), spin-on deposition, etc.). Optionally, as shown in FIG. 4B, an interface layer 152 can be formed on the underlayer 151. See the detailed discussion above regarding the possible materials for and thickness of the interface layer 152. A photoresist layer 153 can be formed (e.g., deposited) either immediately adjacent to the underlayer 151 (as shown in FIG. 4A) or immediately adjacent to an interface layer 152, if present (as shown in FIG. 4B). See the detailed discussion above regarding the possible materials for and thickness of the photoresist layer 153. For purposes of illustration, the remaining method steps will be described below and illustrated in the figures with respect to the structure shown in FIG. 4A, wherein the multi-layer stack does not include an interface layer 152; however, it should be understood that, unless otherwise noted, these same process steps can be performed with respect to the structure shown in FIG. 4B, wherein the multi-layer stack includes an interface layer 152.

It should be noted that the underlayer 151 of the multi-layer stack 150 can be formed immediately adjacent to the top surface of the OPL 143, as shown. Alternatively, before forming the multi-layer stack 150, an optional adhesion layer (not shown) could be formed immediately adjacent to the OPL 143 and the underlayer 151 can be formed on the optional adhesion layer (see process 307).

Figure 5:
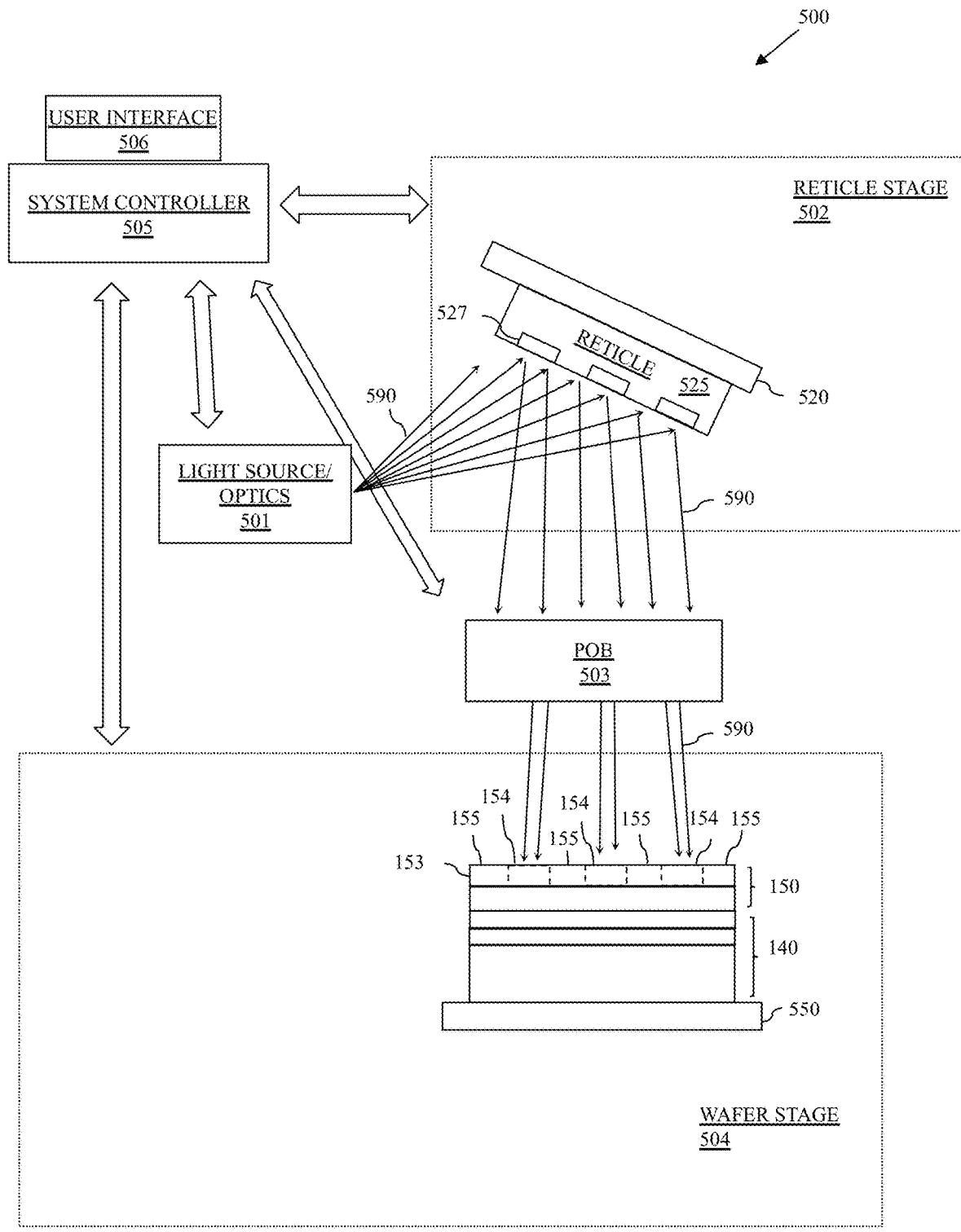
FIG. 5 is block diagram illustrating an exemplary extreme ultraviolet (EUV) photolithography system that can be employed to perform an exposure process during the disclosed method.
Figure 6:
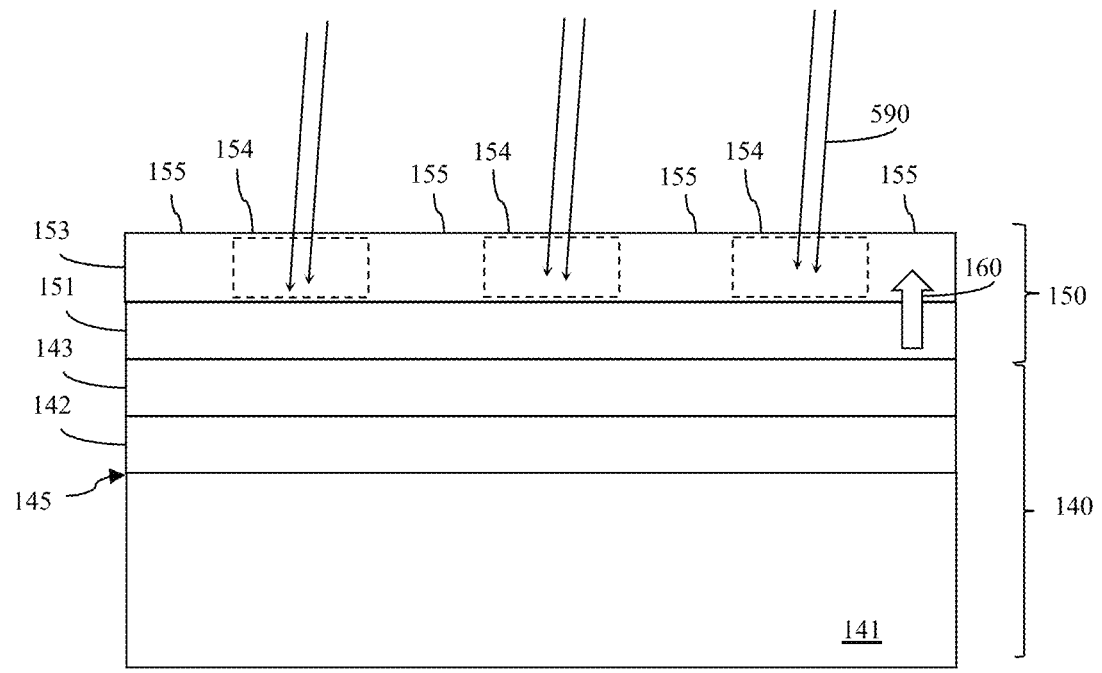
FIG. 6 is a cross-section diagram illustrating radiation-exposed areas of the photoresist layer during the exposure process.

Once the "self-biased" multi-layer stack 150 is formed, a photolithography system (e.g., see the exemplary EUV photolithography system 500 of FIG. 5) can be used to expose certain areas of the photoresist layer 153 to radiation 590, leaving other areas unexposed and, thereby generating a pattern of exposed areas 154 and unexposed areas 155 within the photoresist layer 153 (e.g., to EUV radiation) (see process 310 and FIG. 6).

More specifically, the exemplary EUV photolithography system 500 can include, but is not limited to, the following components: a wafer stage 504, a reticle stage 502, a light source 501, and a projections optics box (POB) 503. The photolithography system 500 can also further include a controller 505 in communication with and adapted to control the light source 501, reticle stage 502, POB 503 and wafer stage 504. The photolithography system 500 can also further include a user interface 506 adapted to allow a user to communicate with the controller 505 and set parameters for performing photolithography operations.

The wafer stage 504 can include a support surface 550 and the back surface of the substrate 141 (e.g., the back surface of the semiconductor wafer) can be detachably coupled (e.g., by means of a wafer chuck (not shown)) to the support surface 550 so that the photoresist layer 153 can be processed.

The reticle stage 502 can include a reticle 525. The reticle 525 can include, for example, a substrate, a reflective multi-layer stack on the substrate, a protective layer on the multi-layer stack and a light absorber layer on the protective layer. The reticle 525 can further include one or more patterned regions 527 in the light absorber layer. Reticle structures for photolithography systems, such as EUV photolithography systems, as well known in the art and, thus, a more detailed description of the reticle 525 has been omitted from the specification in order to allow the reader to focus on the salient aspects of the disclosed embodiments. As illustrated, the bottom surface of the reticle 525 (i.e., the surface opposite the patterned region(s) 527) can be detachably coupled (e.g., by means of a reticle chuck (not shown)) to a support surface 520.

The light source 501 (and corresponding optics) can be capable of generating radiation and directing that radiation toward the patterned region 527 of the reticle 525. For example, the light source 501 can be an extreme ultraviolet (EUV) light source capable of generating EUV light with a wavelength ($\lambda$) in the range of 11-14 nm (e.g., with a $\lambda$=13.5 nm) and aiming beams of that EUV radiation 590 (i.e., EUV light) toward the reticle stage 502.

The projections optics box (POB) 503 (also referred to as a projections optics assembly) can receive (i.e., capture or collect) EUV radiation 590 reflected from the reticle stage 502. The POB 503 can filter the captured radiation (e.g., to remove non-diffracted light) and can direct the filtered radiation toward the wafer stage 504. It should be noted that one or more of the support surface 520 of the reticle stage 502, the support surface 550 of the semiconductor wafer stage, the light source 501 and the POB 503 can be moveable so that the radiation 590 output from the light source 501 will be reflected off the patterned region 527 of the reticle 525 and expose areas 154 of the photoresist layer 153. As a result, a corresponding pattern of exposed areas 154 and unexposed areas 155 will be generated in the photoresist layer 153, as illustrated in FIG. 6. EUV photolithography systems are well known in the art and, thus, the specific details of the components described above including the light source 501 and POB 503 are omitted from this specification in order to allow the reader to focus on the salient aspects of the disclosed invention.

It should be noted that the exemplary photolithography system 500 described above and illustrated in FIG. 5 is exemplary in nature and is not intended to be limiting. Alternatively, any other suitable photolithography system could be used to generate a pattern of exposed areas 154 and unexposed areas 155 in the photoresist layer 153. Regardless of the photolithography system used, the resolution of the pattern will be improved due to the presence of the underlayer 151.

Figure 7:
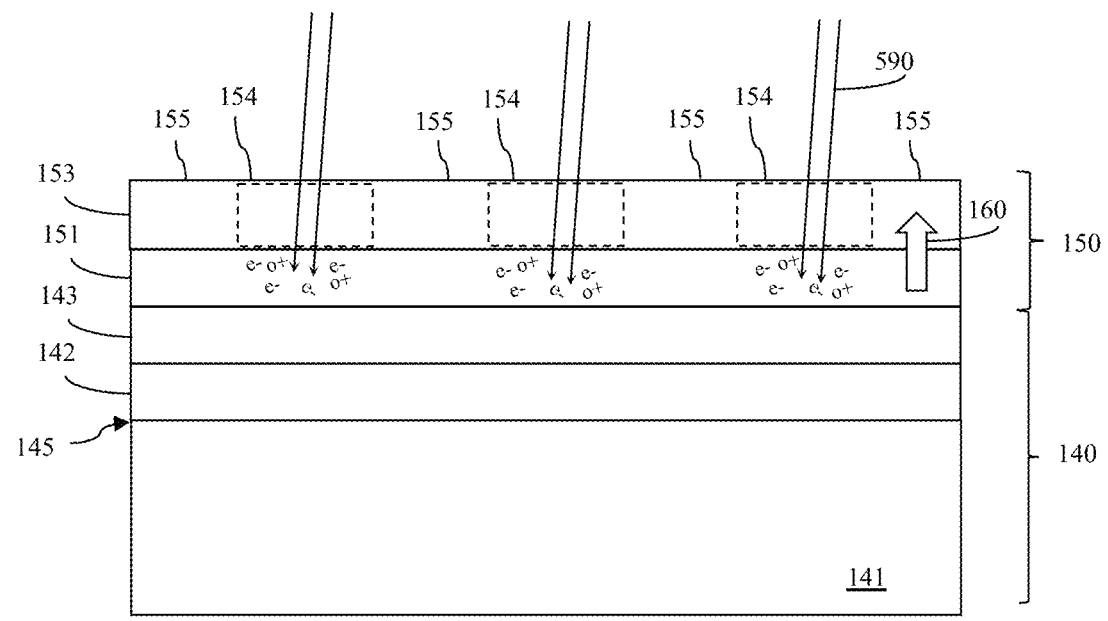
FIG. 7 is a cross-section diagram illustrating radiation-excited electrons and holes in the underlayer during the exposure process.
Figure 8:
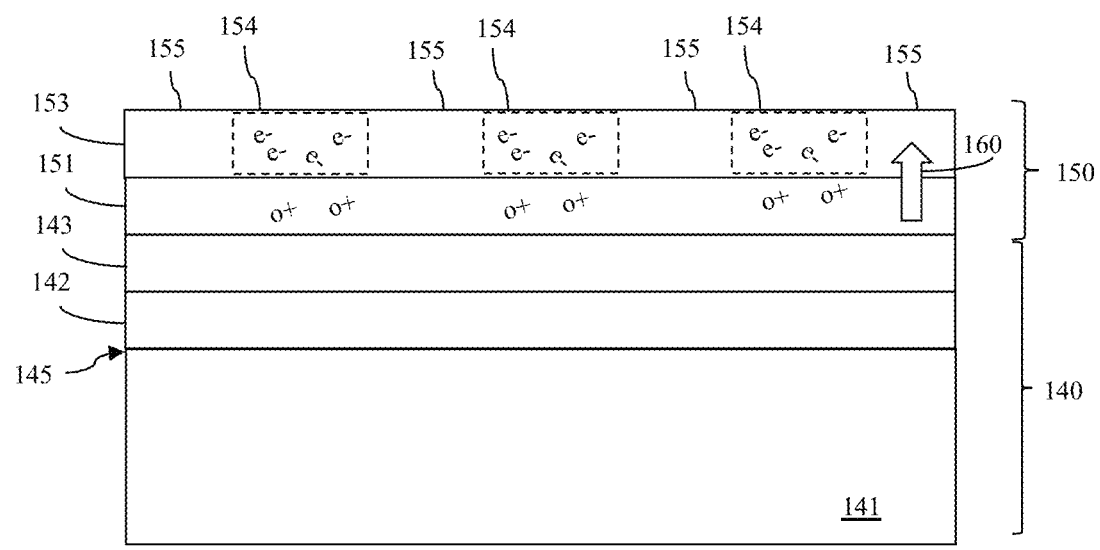
FIG. 8 is a cross-section diagram illustrating movement of the radiation-excited electrons (not holes) from the underlayer into the exposed-areas of the photoresist layer due to an effective internal electric field.

Specifically, as discussed in detail above with regard to the structure embodiments, the material of the underlayer 151 can be specifically selected so that the underlayer 151 has a relatively high radiation absorption percentage and a relatively high radiation extinction coefficient. For example, for EUV photolithography, the underlayer 151 can have a thickness of 10 nm, can have an EUV absorption percentage of at least 25% and an EUV extinction coefficient of at least 0.02. In this case, at least some radiation 590 passes through the exposed areas 154 of the photoresist layer 153, is absorbed by the underlayer 151 and excites electrons ($e^-$) and holes ($o^+$) within areas of the underlayer 151 that are aligned below the exposed areas 154 of the photoresist layer 153, as shown in FIG. 7. Furthermore, also as discussed in detail above with regard to the structure embodiments, the material of the underlayer 151 can also be specifically selected, given the material of the photoresist layer 153, in order to achieve positive valence and conduction band offsets that create (i.e., internally generate) an effective electric field 160 (i.e., a specific EMF) within the multi-layer stack 15 causing the multi-layer stack to become "self-biased". This effective electric field 160 (i.e., the specific EMF) facilitates movement of the radiation-excited electrons ($e^-$) from the underlayer 151 in a direction that is essentially normal to an interface between the underlayer 151 and the photoresist layer 153 and, thereby into the radiation-exposed areas 154 of the photoresist layer 153, as shown in FIG. 8. Additionally, this effective electric field 160 impedes movements of holes (o$^+$) from the underlayer 151 into the photoresist layer 153.

Figure 9:
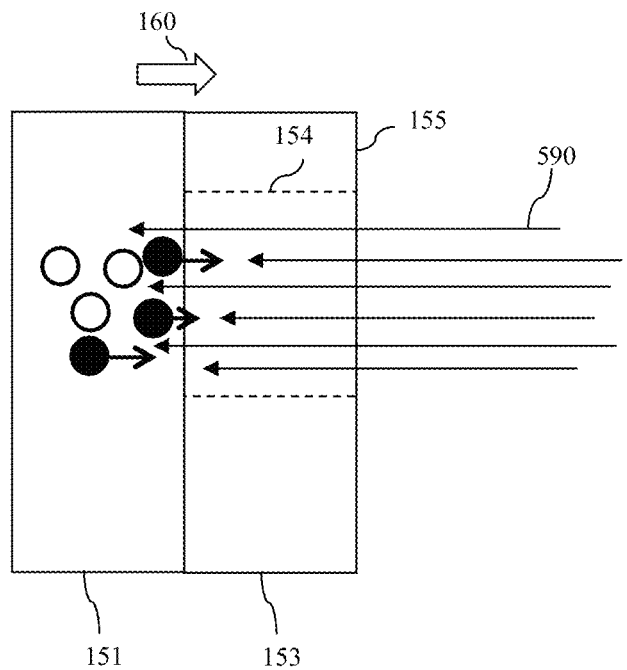
FIG. 9 is perspective drawing further illustrating movement of radiation-excited electrons (not holes) from the underlayer into the exposed-areas of the photoresist layer due to an effective internal electric field.
Figure 9:
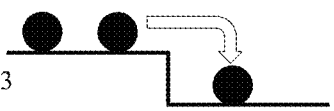
Figure 9:

More specifically, as shown in FIGS. 7-8 and further illustrated in greater detail in FIG. 9, radiation 590 that passes through the photoresist layer 153 will excite both electrons (e$^-$) and holes (o$^+$) in areas of the underlayer 151 that are aligned with the radiation-exposed areas 154 of the photoresist layer 153. Additionally, as mentioned above, the conduction and valence band offset conditions between the underlayer 151 and the photoresist layer 153 include: (1) the difference between the maximum Vb energy of the underlayer 151 and the HOMO energy of the photoresist layer 153 that is at least 0.0 eV and, preferably at least 0.2 eV; and (2) the difference between the minimum Cb energy of the underlayer 151 and the LUMO energy of the photoresist layer 153 that is greater than 0.0 eV and, preferably is at least 0.2 eV. With the first condition, there is no step up in the energy levels between the maximum Vb energy of the underlayer 151 and the HOMO energy of the photoresist layer 153 so hole movement from the underlayer 151 to the photoresist layer 153 is blocked. With the second condition, there is always a step down in the energy levels between the minimum Cb energy of the underlayer 151 and the LUMO energy of the photoresist layer 153. This step down facilitates electron (e$^-$) movement from the underlayer 151 into the photoresist layer 153. Furthermore, given the direction of the effective electric field 160, which is essentially normal to the interface between the underlayer 151 and the photoresist layer 153, the movement of the radiation-excited electrons (e$^-$) in the underlayer 151 will not be random. Instead movement of the radiation-excited electrons (e$^-$) will be in a direction that is also essentially normal to the interface between the underlayer 151 and the photoresist layer 153. Since the radiation-excited electrons (e$^-$) are within areas of the underlayer 151 that are aligned with the radiation-exposed areas 154, the internally generated effective electric field 160 (i.e., the internally generated specific EMF) will cause the radiation-excited electrons (e$^-$) to move into the exposed areas 154 and not the unexposed areas 155 of the photoresist layer 153.

As mentioned above, optionally the underlayer 151 can also be doped with oxygen vacancies, interstitial cation or anion elements or other implantation materials for higher conductivity. For example, optionally, the underlayer 151 can be doped with dopants including, but not limited to, any one or more of the following: zinc (Zn), antimony (Sb), arsenic (As), and/or phosphorus (P) with an implantation energy ranging from 0.5 keV to 3 keV and a dose from 1E12/cm2 to 1E16 ions/cm2. These oxygen vacancies, interstitials or dopants, if present, can increase p-type conductivity of the underlayer, ideally creates a p-n junction at the interface between the underlayer and the photoresist layer that helps the movement of radiation-excited electrons (e$^-$) from the underlayer 151 to the radiation-exposed areas 154 of the photoresist layer 153. Such an increase in electrons (e$^-$) within the exposed areas 154 of the photoresist layer 153 will improve the efficiency of the photoreaction between the radiation 590 and the photoresist material within the radiation-exposed areas 154 of the photoresist layer 153. It should be understood that if a n-p junction were to be created at this interface (i.e., if the underlayer were to have an n-type conductivity and the photoresist layer were to have p-type conductivity) undesirable electrons movement would occur from the photoresist layer into the underlayer.

Figure 10:
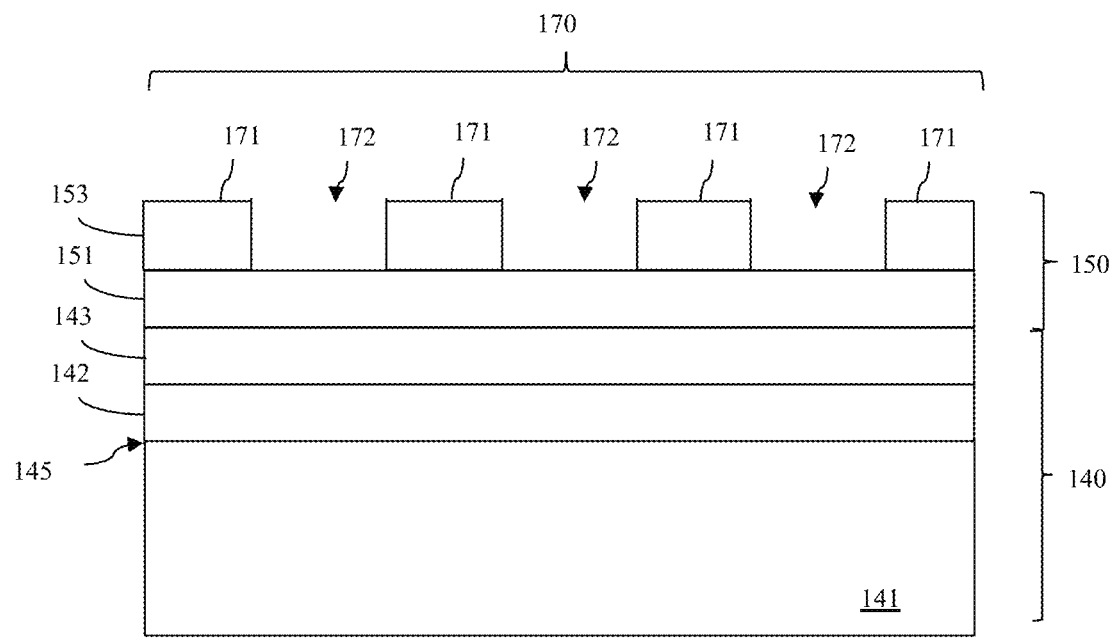
FIGS. 10 and 11 are cross-section diagrams illustrating patterned structures formed according to the disclosed method.

Referring again to FIG. 3, after the exposure process 310 is complete, a photoresist developer can be applied to the photoresist layer 153 to develop the pattern 170 of shapes 171 and openings 172 (e.g., via openings, trenches, etc.) within the photoresist layer 153 (see process 312 and FIG. 10). Those skilled in the art will recognize that if the photoresist layer 153 is a positive photoresist layer, the exposed areas 154 will be soluble to a photoresist developer and the development process will be used to selectively remove those exposed areas to form the openings 172. In this case, the improved efficiency of the photoreaction between the radiation 590 and the photoresist material within the radiation-exposed areas 154 of the photoresist layer 153 due to the increase in electrons, ensures that the radiation-exposed areas 154 become essentially completely soluble and so that very minimal to no residual photoresist material remains in the radiation-exposed areas 154 after the development process. Furthermore, since the radiation-excited electrons (e$^-$) move from the underlayer 151 into the radiation-exposed areas 154 and not randomly, reactions in the photoresist layer 153 that would make the unexposed areas 155 become soluble are avoided. Those skilled in the art will also recognize if the photoresist layer 153 is a negative photoresist layer, only the unexposed areas 155 will be soluble to a negative photoresist developer and the development process will be used to selectively remove the unexposed areas 155 to form the openings 172. In this case, the improved efficiency of the photoreaction between the radiation 590 and the photoresist material within the radiation-exposed areas 154 of the photoresist layer 153 due to the increase in electrons, ensures that the radiation-exposed areas 154 become essentially completely insoluble and so that little to no photoresist material from the radiation-exposed areas 154 is removed during the development process. Furthermore, since the radiation-excited electrons (e$^-$) move from the underlayer 151 into the radiation-exposed areas 154 and not random, reactions in the photoresist layer 153 that would make the unexposed areas 155 become insoluble are avoided.

Thus, the improved efficiency in the photoreaction between the radiation 590 and the photoresist material within the radiation-exposed areas 154 of the photoresist layer 153 provides for improved resolution and clarity in the developed pattern 170. That is, following the development process 312, the shapes 171 within the developed pattern 170 will be more clearly defined with sharp edges and the openings 172 within the developed pattern 170 will include little to no residual photoresist material. Thus, by using the "self-biased" multi-layer stack 150 during photolithography and, particularly, during exposure at process 310, the method minimizes or avoids altogether stochastic defects.

It should be understood that if the conduction band offset between the underlayer and the photoresist layer were negative (as opposed to positive) electron movement from the underlayer into the photoresist layer would be impeded and/or if the valence band offset between the underlayer and the photoresist layer were negative (as opposed to positive) hole movement from the underlayer into the photoresist layer would be facilitated. Either condition would violate the band offset conditions of the disclosed embodiments, reducing the efficiency of the photoreaction between the radiation and the photoresist material and negatively impacting the resolution and clarity of the resulting pattern.

Figure 11:
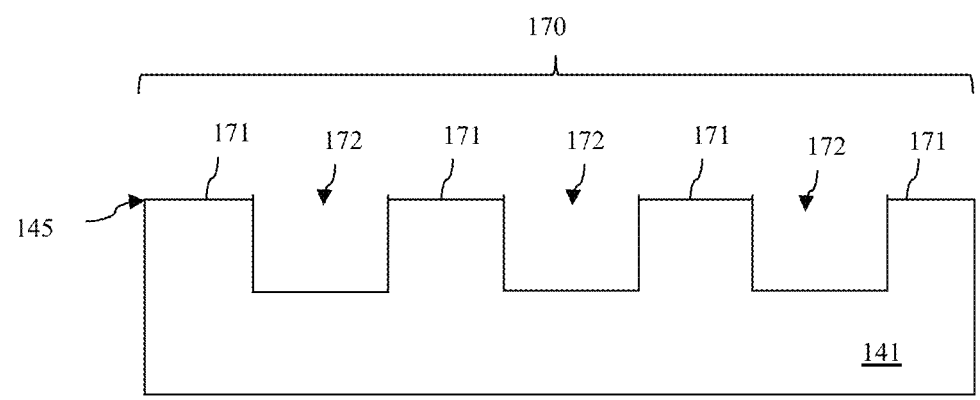

Once the photoresist layer 153 has been developed at process 312, selective anisotropic etch processes can be performed in order to transfer the developed pattern 170 through the optional interface layer 152, the underlayer 151, the OPL 143, and the hardmask layer 142 and into the substrate 141 (see process 314 and FIG. 11). The various stacked layers including the photoresist layer 153, the optional interface layer 152, the underlayer 151, the OPL 143 and, optionally, the hardmask layer 142 can be selectively removed between the anisotropic etch processes (e.g., after the layer immediately below has been patterned) or following the anisotropic etch processes.

As mentioned above, in the above-described embodiments, the increase in electrons within the exposed areas 154 of the photoresist layer 153 improves the efficiency of the photoreaction between the radiation 590 and the photoresist material within the radiation-exposed areas 154 of the photoresist layer 153 and this improved reaction efficiency provides for improved resolution and clarity in the developed pattern 170. Additionally, given the improved photoreaction efficiency, the amount of radiation (i.e., the radiation dose) required during the exposure process to achieve developed critical dimensions (DCD) for the shapes 171 and openings 172 in the developed pattern 170 can be reduced.

Figure 12A:
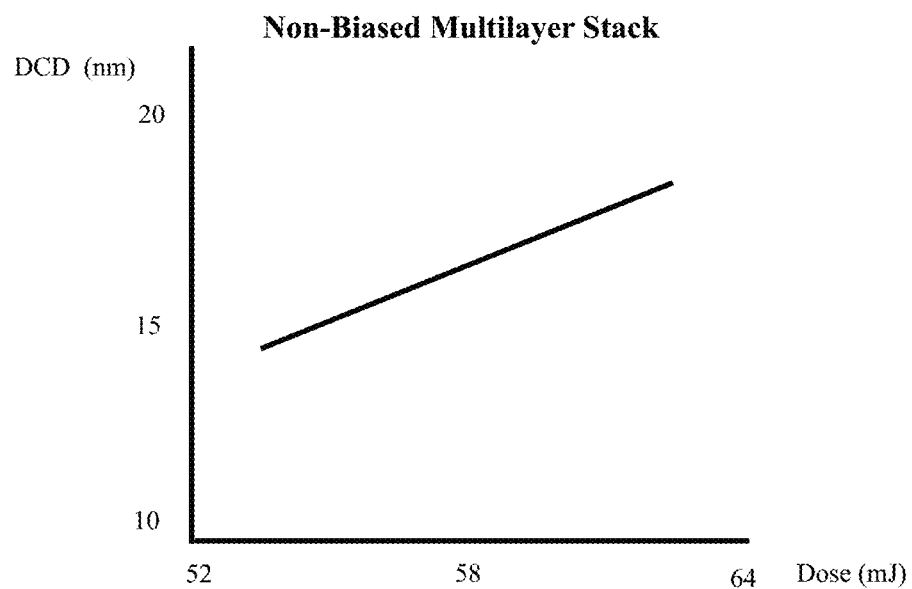
FIG. 12A is a chart illustrating extreme ultraviolet (EUV) dose to critical dimension (CD) process specifications for conventional EUV photolithography and FIG. 12B is a SEM image of an exemplary non-biased multi-layer stack used for this conventional EUV photolithography.
Figure 12B:
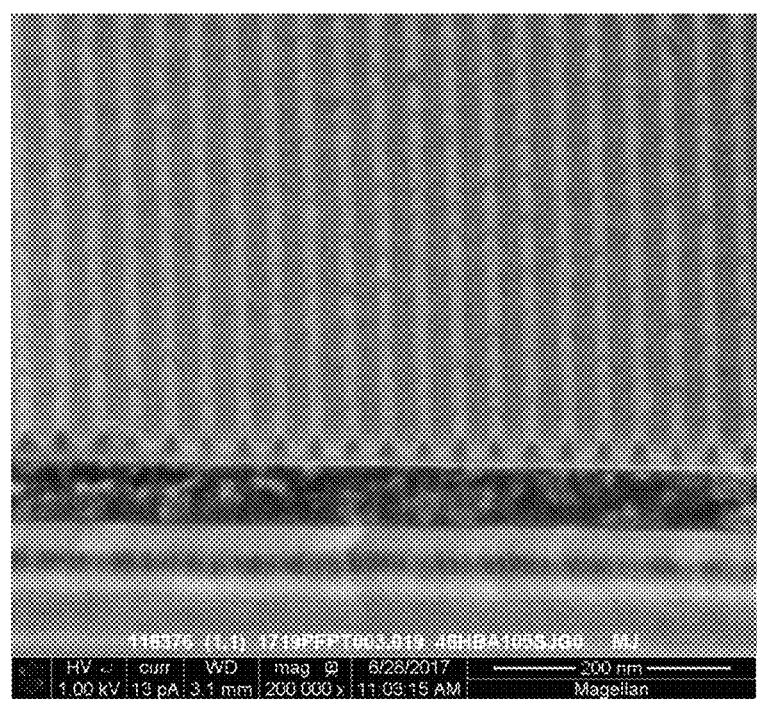
Figure 13A:
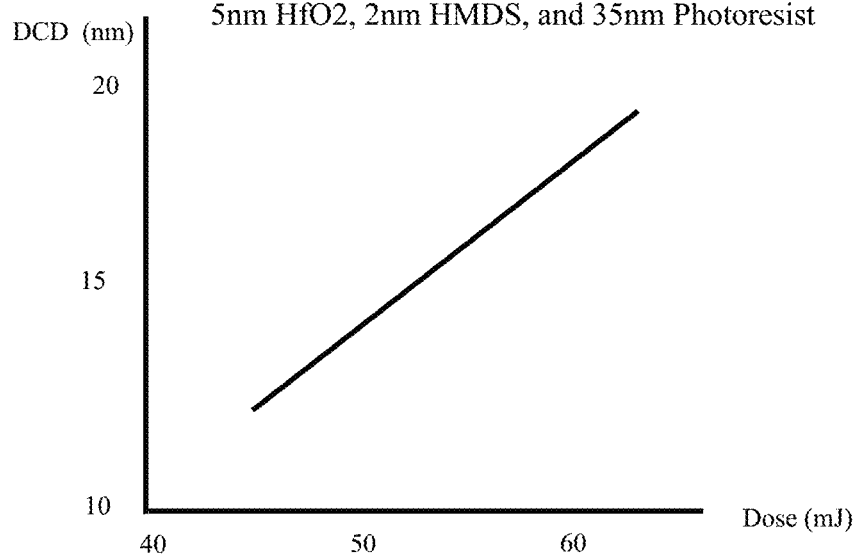
FIG. 13A is a chart illustrating extreme ultraviolet (EUV) dose to critical dimension (CD) specifications for the disclosed photolithography method and FIG. 13B is a SEM image of an exemplary "self-biased" multi-layer stack used for this disclosed photolithography method.
Figure 13B:
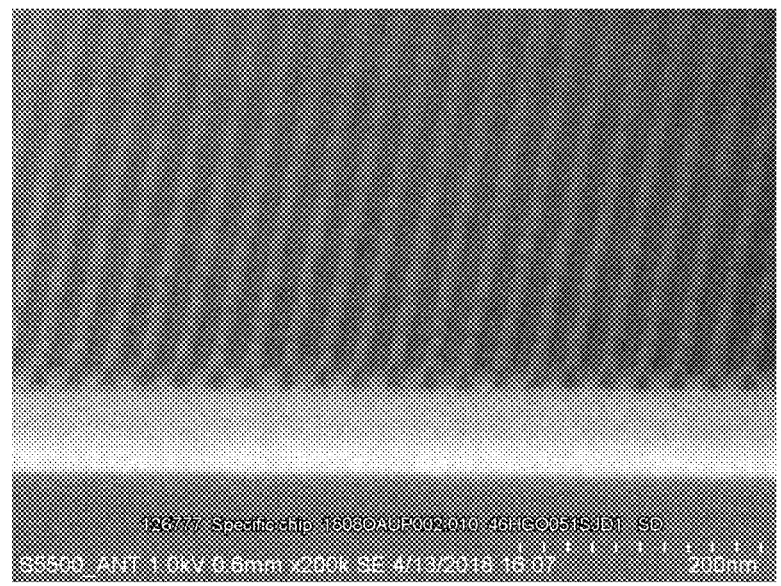

For example, as illustrated in the graph of FIG. 12A, if a non-biased multi-layer stack with a photoresist layer (as shown in the SEM image of FIG. 12B) is used during EUV photolithography, an EUV dose of approximately 54 mJ could be required to achieve a DCD of approximately 14 nm consider and a EUV dose of approximately 62 mJ could be required to achieve a DCD of approximately 17 nm. Furthermore, the process window of available dose and focus combinations is relatively small. As illustrated in the graph of FIG. 13A, if a "self-biased" multi-layer stack 150 that includes, for example, an underlayer 151 of hafnium(IV) oxide ($HfO_2$) with a thickness of 5 nm, an interface layer 152 of HMDS with a thickness of lnm, and a chemically amplified positive photoresist layer with a thickness of 35 nm (as illustrated in the SEM image of FIG. 13B), is used during EUV photolithography with the same system, an EUV dose of only approximately 49 mJ could be required to achieve the same 14 nm DCD and an EUV dose of only approximately 56 mJ could be required to achieve the same 17 nm DCD. Furthermore, the process window of available dose and focus combinations is significantly larger than that available for the non-biased multi-layer stack of FIGS. 12A-12B and the pattern exhibits significantly less scumming following development (i.e., fewer areas where photoresist material remains in exposed areas of the photoresist layer following development).

It should be understood that the terminology used herein is for the purpose of describing the disclosed structures and methods and is not intended to be limiting. For example, as used herein, the singular forms "a", "an" and "the" are intended to include the plural forms as well, unless the context clearly indicates otherwise. Additionally, as used herein, the terms "comprises" "comprising", "includes" and/or "including" specify the presence of stated features, integers, steps, operations, elements, and/or components, but do not preclude the presence or addition of one or more other features, integers, steps, operations, elements, components, and/or groups thereof. Furthermore, as used herein, terms such as "right", "left", "vertical", "horizontal", "top", "bottom", "upper", "lower", "under", "below", "underlying", "over", "overlying", "parallel", "perpendicular", etc., are intended to describe relative locations as they are oriented and illustrated in the drawings (unless otherwise indicated) and terms such as "touching", "in direct contact", "abutting", "directly adjacent to", "immediately adjacent to", etc., are intended to indicate that at least one element physically contacts another element (without other elements separating the described elements). The term "laterally" is used herein to describe the relative locations of elements and, more particularly, to indicate that an element is positioned to the side of another element as opposed to above or below the other element, as those elements are oriented and illustrated in the drawings. For example, an element that is positioned laterally adjacent to another element will be beside the other element, an element that is positioned laterally immediately adjacent to another element will be directly beside the other element, and an element that laterally surrounds another element will be adjacent to and border the outer sidewalls of the other element. The corresponding structures, materials, acts, and equivalents of all means or step plus function elements in the claims below are intended to include any structure, material, or act for performing the function in combination with other claimed elements as specifically claimed.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

Therefore, disclosed above are embodiments of a structure and, particularly, a "self-biased" multi-layer stack and methods and systems that use the "self-biased" multi-layer stack during photolithography (e.g., during extreme ultraviolet (EUV) photolithography) for improved pattern resolution. Specifically, the multi-layer stack includes a photoresist layer and an underlayer below the photoresist layer (e.g., either immediately adjacent to or adhered to by a thin interface layer). The underlayer and the photoresist layer are made of different materials. The material of the underlayer is specifically selected so that the underlayer has a relatively high radiation absorption percentage (e.g., a relatively high EUV radiation absorption percentage) and so that positive valence and conduction band offsets between the underlayer and the photoresist layer create an effective internal electric field (i.e., cause the multi-layer stack to be "self-biased"). When areas of the photoresist layer are subsequently exposed to radiation (e.g., EUV radiation) and the radiation passes through to the underlayer, the effective electric field facilitates movement of any radiation-excited electrons from the underlayer into the radiation-exposed areas of the photoresist layer in a direction that is essentially normal to an interface between the underlayer and the photoresist layer and also impedes movement of any radiation-excited holes from the underlayer into the photoresist layer. The addition of these radiation-excited electrons in the radiation-exposed areas of the photoresist layer improves the efficiency of the photoreaction between the radiation and the photoresist material within the radiation-exposed areas, thereby enhancing photoresist layer development and pattern resolution and eliminating or at least minimizing stochastic defects.

What is claimed is:
1. A structure comprising:
an underlayer on a substrate; and
a photoresist layer on the underlayer, wherein the photoresist layer comprises: radiation-exposed areas; and non-radiation exposed areas, wherein portions of the underlayer aligned below the radiation-exposed areas of the photoresist layer comprise radiation-excited electrons and radiation-excited holes, wherein the underlayer and the photoresist layer comprise different materials that create an effective electric field between the underlayer and the photoresist layer, and wherein the effective electric field facilitates movement of the radiation-excited electrons from the underlayer into the radiation-exposed areas of the photoresist layer and impedes movement of the radiation-excited holes from the underlayer into the photoresist layer.

2. The structure of claim 1, wherein the effective electric field is created due to valence and conduction band offsets between the underlayer and the photoresist layer and wherein the offsets comprise:

a maximum valence band energy of the underlayer that is higher than a highest occupied molecular orbital (HOMO) energy of the photoresist layer such that a difference between the maximum valence band energy of the underlayer and the highest occupied orbital (HOMO) energy of the photoresist layer is greater than 0.0 eV; and a minimum conduction band energy of the underlayer that is higher than a lowest unoccupied molecular orbital (LUMO) energy of the photoresist layer such that a difference between the minimum conduction band energy of the underlayer and the lowest unoccupied molecular orbital (LUMO) energy of the photoresist layer is greater than 0.0 eV.

3. The structure of claim 1, wherein the underlayer has an extreme ultraviolet radiation extinction coefficient of at least 0.02.

4. The structure of claim 1, wherein the underlayer comprises any of indium(III) oxide, nickel(II) oxide, zinc oxide, copper(I) oxide, cobalt (III) oxide, hafnium(IV) oxide, and chromium (III) oxide.

5. The structure of claim 1, wherein the underlayer comprises is a p-type underlayer and the photoresist layer comprises an n-type photoresist layer.

6. The structure of claim 1, further comprising an interface layer between the photoresist layer and the underlayer.

7. A structure comprising:
an underlayer on a substrate;
an interface layer on the underlayer, wherein the interface layer comprises a self-assembled mono-layer material; and
a photoresist layer on the interface layer,
wherein the photoresist layer comprises: radiation-exposed areas; and non-radiation exposed areas,
wherein portions of the underlayer aligned below the radiation-exposed areas of the photoresist layer comprise radiation-excited electrons and radiation-excited holes,
wherein the underlayer and the photoresist layer comprise different materials that create an effective electric field between the underlayer and the photoresist layer, and
wherein the effective electric field facilitates movement of the radiation-excited electrons from the underlayer into the radiation-exposed areas of the photoresist layer and impedes movement of the radiation-excited holes from the underlayer into the photoresist layer.

8. The structure of claim 7, wherein the self-assembled mono-layer material comprises hexamethyldisilazane.

9. The structure of claim 7, wherein the self-assembled mono-layer material enhances adhesion of the photoresist layer to the underlayer.

10. The structure of claim 7, wherein the self-assembled mono-layer material further facilitates movement of the facilitates movement of the radiation-excited electrons from the underlayer into the radiation-exposed areas of the photoresist layer.

11. The structure of claim 7, wherein the effective electric field is created due to valence and conduction band offsets between the underlayer and the photoresist layer and wherein the offsets comprise:

a maximum valence band energy of the underlayer that is higher than a highest occupied molecular orbital (HOMO) energy of the photoresist layer such that a difference between the maximum valence band energy of the underlayer and the highest occupied orbital (HOMO) energy of the photoresist layer is greater than 0.0 eV; and a minimum conduction band energy of the underlayer that is higher than a lowest unoccupied molecular orbital (LUMO) energy of the photoresist layer such that a difference between the minimum conduction band energy of the underlayer and the lowest unoccupied molecular orbital (LUMO) energy of the photoresist layer is greater than 0.0 eV.

12. The structure of claim 7, wherein the underlayer has an extreme ultraviolet radiation extinction coefficient of at least 0.02.

13. The structure of claim 7, wherein the underlayer comprises any of indium(III) oxide, nickel(II) oxide, zinc oxide, copper(I) oxide, cobalt (III) oxide, hafnium(IV) oxide, and chromium (III) oxide.

14. The structure of claim 7, wherein the underlayer comprises is a p-type underlayer and the photoresist layer comprises an n-type photoresist layer.

15. A structure comprising:
a p-type underlayer on a substrate; and
an n-type photoresist layer immediately adjacent to the underlayer such that a p-n junction is at an interface between the p-type underlayer and the n-type photoresist layer,
wherein then-type photoresist layer comprises: radiation-exposed areas; and non-radiation exposed areas,
wherein portions of the p-type underlayer aligned below the radiation-exposed areas of the n-type photoresist layer comprise radiation-excited electrons and radiation-excited holes,
wherein the p-type underlayer and the n-type photoresist layer comprise different materials that create an electric field between the underlayer and the photoresist layer, and
wherein the electric field facilitates movement of the radiation-excited electrons from the p-type underlayer into the radiation-exposed areas of the n-type photoresist layer and impedes movement of the radiation-excited holes from the p-type underlayer into the n-type photoresist layer.

16. The structure of claim 15, wherein the n-type photoresist layer comprises any of the following:
a chemically amplified positive organic photoresist layer doped so as to have n-type conductivity;
a chemically amplified negative organic photoresist layer; and a non-chemically amplified photoresist layer having a naturally occurring n-type conductivity.

\* \* \* \* \*